United States Patent [19]

Satoh et al.

[11] Patent Number: 4,891,334

[45] Date of Patent: Jan. 2, 1990

[54] PROCESS FOR PRODUCTION OF ELECTRONIC DEVICES UTILIZING NOVOLAK RESIN AS PROTECTIVE MATERIAL

[75] Inventors: Masaki Satoh, Yokohama; Shigemitsu Kamiya; Nobuo Fujie, both of Kawasaki; Shuji Tabuchi, Kuwana, all of Japan

[73] Assignees: Nippon Zeon Co., Ltd., Tokyo; Fujitsu Limited, Kawasaki, both of Japan

[21] Appl. No.: 268,402

[22] Filed: Nov. 8, 1988

[30] Foreign Application Priority Data

Nov. 10, 1987 [JP] Japan .............................. 62-282207

[51] Int. Cl.$^{4}$ .................. H01L 21/304; H01L 21/306

[52] U.S. Cl. .................................. 437/228; 437/229; 437/231; 156/636

[58] Field of Search ............... 437/225, 228, 229, 231; 430/313; 156/636

[56] References Cited

U.S. PATENT DOCUMENTS 4,266,334 5/1981 Edwards et al. .................... 437/225

4,294,911 10/1981 Guild .................................. 430/326

4,308,368 12/1981 Kubo et al. ......................... 430/190

FOREIGN PATENT DOCUMENTS 62-196832 8/1987 Japan .

*Primary Examiner*—Olik Chaudhuri

*Attorney, Agent, or Firm*—Armstrong, Nikaido, Marmelstein, Kubovcik & Murray

[57] ABSTRACT

A protective material for electronic parts comprises monoalkylated phenol.formaldehyde novolak resin having 6 to 12 carbon atoms in the alkyl group, and a process for the production of electronic parts, which comprises the following steps A to C:

A. covering a device side surface of a semiconductor plate on which semiconductor elements and so forth are mounted with a protective film of a protective material comprising monoalkylated phenol.formaldhyde novolak resin having 6 to 12 carbon atoms in the alkyl group;

B. finishing the other or backside surface of the semiconductor plate, not covered with the protective film, to reduce the thickness of the plate; and C. removing the protective film with a solvent.

6 Claims, 1 Drawing Sheet

10 9 8 7 5 4 3 1 6 2

9 8 7 5 4 3 1 6 2

PROCESS FOR PRODUCTION OF ELECTRONIC DEVICES UTILIZING NOVOLAK RESIN AS PROTECTIVE MATERIAL

BACKGROUND OF THE INVENTION

The present invention relates to a protective material for electronic parts and devices, and a process for the production of electronic devices utilizing the protective material. More specifically, the invention relates to a protective material which can exhibit a remarkable characteristic of protecting electronic parts, for example semiconductor elements formed on semiconductor substrates, in mechanically grinding or chemically etching the semiconductor substrates and yet can be stripped or removed with ease. The material is also useful for a protective film for protecting for example liquid-crystal display plates against deposition of dust or the like. The invention also relates to a process for the production of electronic devices while a necessary protection of the devices is effected with use of the protective material.

It is conventionally practiced in preparation for the production of chips by cutting a semiconductor plate such as for example a silicon wafer having semiconductor elements, electrodes and so forth formed thereon to mechanically grind or chemically etch a backside surface of the semiconductor plate to process this plate to the prescribed thickness and smoothen its backside surface.

Regardless whether it is done by a mechanical grinding method or by an etching method using a chemical, such processing of semiconductor substrates is carried out in the condition in which a device side surface of the plates on which semiconductor elements and so forth are arranged is protected by a covering of a protective film so that the device side surface can be protected against impairing or any other adverse affect.

The protective film for use as above is required to possess the following characteristics.

(1) It is tough enough not to become broken through a mechanical grinding.

(2) It is resistant against acids used as etchant in chemical etching.

(3) After it is used in a grinding or etching step, it can be easily stripped or removed with chemicals which are not corrosive of semiconductor elements, interconnection elements and so forth.

In the prior art, it is known to use for the protective material a cyclized rubber based negative photoresist or a novolak resin based positive photoresist, for example from Japanese patent application Kokai publication Nos. 54-41068, 57-10933, 57-192031, 59-117219 and 61-110435.

However, the known protective materials are not fully satisfactory: With cyclized rubber based nagative photoresists, while they have remarkable toughness and acid resistance as a protective film, they inconveniently involve the need of using harmful phenol or chlorinated olefins in removing them after they are used in the process for etching. In addition, they are hardly removable and a relatively long time has to be consumed in removing them. With novolak resin based positive photoresists, then, not only their strength or toughness as a protective film is so poor that they are prone to become broken relatively with ease but also their acid resistance is relatively limited. Also, alike the above cyclized rubber based negative photoresits, the novolak resin based positive photoresists, too, involve the need of using a chemical exclusively for their removal.

Further, it is also widely practiced to apply protective films over surfaces of various electronic parts and devices such as semiconductor substrates, liquid crystal display plates and so forth so that they can be prevented from undergoing deposition of dusts or the like present in the atmosphere, as needs be possibly when they have to be kept in stock or they are packaged and shipped. For protective films for such use, too, the above-mentioned known protective materials are utilized, which however are found to fail to be satisfactory with respect to both of the mechanical strength and the removability after service.

BRIEF SUMMARY OF THE INVENTION

Accordingly, it is a primary object of the present invention to obviate the above indicated problems in the prior art and provide a protective material for electronic parts and devices which can exhibit a high film strength or toughness and a remarkable resistance to acids and which can be removed with ease at room temperatures.

It also is an object of the invention to provide a process for the production of electronic parts and devices while they are maintained in a protected condition.

The above primary object of the invention can be attained by providing a protective material for electronic parts and devices, which comprises monoalkylated phenol.formaldehyde novolak resin having 6 to 12 carbon atoms in the alkyl group.

The further object of the invention can be attained by providing a process for the production of electronic parts and devices, which comprises the following steps A to C.

A. covering a device side surface of a semiconductor substrate on which semiconductor elements and so forth are mounted with protective film of a protective material comprising monoalkylated phenol.formaldhyde novolak resin having 6 to 12 carbon atoms in the alkyl group;

B. finishing the other or backside surface of the semiconductor plate, not covered with the protective film, to reduce the thickness of the plate; and C. removing the protective film with a solvent.

BRIEF DESCRIPTION OF THE DRAWINGS

The above and other features and advantages of the present invention will become more apparent from considering the following description in conjunction with the accompanying drawings, in which.

DESCRIPTION OF THE PREFERRED EMBODIMENTS

Figure 1:
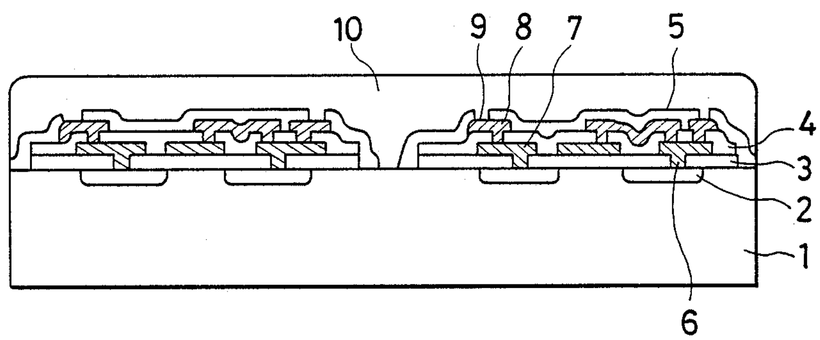
FIG. 1 is a schematic sectional view, showing an initial condition in which semiconductor elements, electrodes and so forth arranged on a semiconductor substrate or wafer are covered with a protective film according to an embodiment of the present invention.

The protective material for electronic parts and devices according to the present invention comprises monoalkylated phenol.formaldehyde novolak resin, of which the alkyl group has a carbon atom number of 6 to 12 or, more preferably, 6 to 8.

Such monoalkylated phenols of which the alkyl group has a smaller carbon atom number than 6 cannot provide a protective film having a high enough toughness that when it is formed on the surface of an electronic part it is not easily broken. Also, the film does not have a sufficient acid resistance. Thus, in this case, it is infeasible to attain the intended result according to the invention.

On the other hand, monoalkylated phenols of which the alkyl group has a greater carbon atom number than 12 are industrially not easily obtainable, and they are not useful from practical points of view.

The position of the alkyl group in the monoalkylated phenol may be the metha position or the para position or, more preferably, the para position, to the hydroxyl group. In greater detail, the monoalkylated phenol for use for purposes of the present invention are represented by p-hexylphenol, p-octylphenol, p-nonylphenol, p-decylphenol, p-undecylphenol and p-laurylphenol. It is also possible according to the invention to use a mixture of m-alkylphenol and p-alkylphenol or a mixture of monoalkylated phenols having in their alkyl groups a carbon atom number within the above-mentioned range, namely 6 to 12.

The monoalkylated phenol.formaldehyde novolak resin for use for or in the present invention can be easily produced according to any of known methods of the production of novolak resins. For example, it can be prepared by mixing together monoalkylated phenol and formalin in a molar ratio of 1:0.8 to 1.5, reacting the resulting mixture in the presence of an acid catalyst for example oxalic acid or hydrochloric acid, by heating under a reflux temperature condition, and cooling the reaction product and then pulverizing the solidified product. The novolak resins thus obtained will present a pale yellow or a pale yellow ocher color, and generally their weight-average molecular weights (based on polystyrene) are 500 to 3,000 or, more preferably for purposes of the present invention, 1,000 to 2,000.

The protective material according to the present invention may contain appropriate amounts of additives such as a colorant, a plasticizer, a surfactant and so forth depending on specific needs.

The process for the production of electronic parts and devices utilizing the above described protective material according to the present invention may be carried out in practice as follows.

Initially, it is operated to apply, for example by coating, a solvent solution of the above described monoalkylated phenol.formaldehyde novolak resin on the device side surface of a semiconductor substrate, for example a silicon wafer, on which semiconductor elements, electrodes and so forth are mounted, and the substrate is then heated to remove the solvent and form a protective film of the novolak resin.

For the solvent, use may be made of any of 2-ethoxy ethyl acetate, methyl ethyl ketone and so forth. Although it may vary depending on the kind of the solvent used and the film thickness to be obtained, the concentration of the novolak resin in the solvent solution is normally 20 to 60 wt. %.

It is then operated to mechanically grind or chemically etch the other side surface of the secmiconductor substrate or plate, namely the backside surface not covered with the protective film, to thereby reduce the thickness of the plate and smoothen this side surface.

The mechanical grinding can be worked, using a grinding machine which may normally be such a one as disclosed in the U.S. Pat. Nos. 4,481,738 or 4,583,325 to Tabuchi, and in a manner such that while the semiconductor plate is held in position with its device side sucked by a vacuum chuck, the backside surface of the plate is ground by a grinding wheel.

In the cases of chemical etching, the semiconductor substrate applied with the protective film is dipped for several minutes in an etchant comprising a mixed acid of hydrofluoric acid annd nitric acid (the concentration of hydrofluoric acid: 5%, that of nitric acid: 20%), maintained at a temperature of 20° to 40° C., and thereafter a spin washing with super-demineralized water and a spin drying are operated, to effect an etching.

Finally, after the completion of the grinding or etching, the protective film is removed with use of a solvent at room temperature, and immediately thereafter, washing with super-demineralized water is performed.

The solvent for the film removal may be any of alcohols such as methanol, ethanol and isopropyl alcohol, ketones such as acetone, methyl ethyl ketone, and methyl isobutyl ketone, and mixtures thereof.

As described above, the protective material for electronic parts and devices according to the present invention can provide a film for the protection of surfaces of various electronic parts and devices such as semiconductor plates or wafers, which film is exceedingly remarkable with respect to each of the film strength or toughness, the acid resistance and the removability at room temperatures in comparison to known protective films. Thus, using the protective material according to the invention, the production of electronic parts and devices can be carried out, free of the dangerous step of using a chemical exclusively for the film removal which is injurious to health and expensive as well but which had to be used in great amounts in the prior art. Also, the complexity to do with the production steps can be avoided. Thus, the protective material according to the invention can be utilized economically advantageously as well as safely.

Using the protective material according to the invention, further, it is feasible to produce semiconductor devices comprising a semiconductor plate or substrate processed by surface finishing to a thickness as desired, which can be produced while semiconductor elements and so forth formed or mounted on the semiconductor plate is safely protected against impairing.

The present invention will now be described in further detail in connection with Examples and Comparative Examples, in which parts and percentage (%) values are by weight unless otherwise specified.

Comparative Example 1:

Using a spin coater, a cyclized rubber based photoresist, a commercially available protective resist for surface finishing, was coated on each of a silicon wafer (4 inch ϕ) formed with a 5,000 A-thick film of a thermal oxide and a silicon wafer (4 inch ϕ) formed with a vapor deposited film of aluminum having a thickness of 1,000 A, and baking of the respective wafers was operated on a hot plate initially at 90° C. for 1 minute (pre-baking)

and then at 160° C. for 5 minutes to form a protective film of a film thickness of 20 μm on each of the wafers.

Then, each of the above wafers formed with the protective film was dipped for 1 minute in an etchant comprising a mixed acid of hydrofluoric acid (concentration: 5%) and nitric acid (concentration: 5%), which was maintained at 30° C., and then subjected to spin washing with super-demineralized water and spin drying. The protective film on the silicon wafer formed with the 1,000 A-thick vapor depositied aluminum film was physically peeled off with use of a nitrogen pressure, and the exposed aluminum surface was visually inspected through a metallurgical microscope to find that no change took place in the surface condition during the above etching.

Then, to remove the protective film from the silicon wafer formed with the 5,000 A-thick thermal oxide film, this wafer was immersed in a commercially obtained phenol based remover solution, which was maintained at 120° C., and determinations were made of the length of time for the immersion and the condition of removal of the protective film. As a result of this, it was found that it took at least 40 minutes before the protective film became completely peeled off the wafer. The surface of the wafer taken out of the remover solution was polluted with the viscous solution, so that the wafer was rinsed in trichloroethylene maintained at 50° C. while it was kept moving to find that the remover solution polluted the wafer surface was removed in 10 minutes of the rinsing.

The wafer removed of the protective film as above was rinsed in isopropyl alcohol for 5 minutes, and then subjected to a spin washing with super-demineralized water and a spin drying. Then, through a metallurgical microscope, an inspection of the surface of the thermal oxide film was operated to find that the surface condition did not undergo a change.

From the above results of tests, it is seen that while the used protective resist marketed for use in surface finishing is possessed of a resistance to etchants for silicon wafers, its removal requires a high temperature and takes a long time. To add to that, this protective resist involves the requirement for complex processes up to a washing with super-demineralized water.

EXAMPLE 1

Dissolving p-hexylphenol.formaldehyde novolak resin [weight-average molecular weight: 1690, based on polystyrene (the same as this applies in the following)] in 2-ethoxy ethyl acetate to prepare a solution having a solid concentration of 50%, which was filtered through a Teflon-made membrane filter having a pore size of 0.5 μm. The filtrate solution was coated on 4-inch φ silicon wafers having 1 mm square aluminum pads of a thickness of 1,000 A arranged thereon, and a baking was operated at 100° C. for 5 minutes to form a protective film of a thickness of 20 μm on the surface of the wafer.

(1) Acid resistance Test

Under the same conditions as in the above described Comparative Example 1, the backside surface of samples of the above silicon wafers were subjected to etching, spin washing with super-demineralized water and spin drying, which were performed in that order. As a result of a then operated inspection through an optical microscope, it was ascertained that the surface of the protective film did not undergo a change. Then, with wafer samples which were subjected to a film-removability test conducted as described in the below paragraph (2), the occurrence of abnormality on their aluminum pads (if the aluminum pads underwent a change in color, this was regarded as an abnormlity occurred) was determined in connection with 80 aluminum pads in total in a longitudinal direction and a transverse direction, by a visual inspection through a metallurgical microscope. Results of determinations are shown in the below Table 1, and as seen from the Table 1, the aluminum pads did not undergo a color change in each of the cases of use of four different kinds of remover chemicals, and the protective film is found to have a remarkable acid resistance to the etchant.

(2) Film-Removability Test

Film-removability tests were conducted in connection with the silicon wafer of which the etching, spin washing and spin drying were completed as described in the above paragraph (1). Four different kinds of remover chemical were used, which were methanol, ethanol, isopropyl alcohol and acetone, each of which was placed in a vessel made of polytetrafluoroethylene. While the chemical in the vessel was stirred by a magnetic stirrer, wafer samples were dipped in the chemical, and the required length of time before the wafer surface became completely exposed was determined (at a room temperature of 23.5° to 24° C.).

Results of determinations are shown in the below Table 2, from which it is seen that the required time for the film removal at room temperatures is by far shorter in the case of the protective film according to the present Example 1 in comparison to the case of the protective resist of the prior art shown in the above Comparative Example 1. In addition, in the present Example, the wafer surface did not undergo a pollution with the remover chemical, and through a spin washing with super-demineralized water and a spin drying, it was feasible to obtain a clean wafer surface condition.

EXAMPLE 2

Acid resistance tests and film-removability tests were operated in same manners as in Example 1 except that in place of the p-hexylphenol.formaldehyde novolak resin used in Example 1, p-octylphenol.formaldehyde novolak resin (weight-average molecular weight: 1830) was used. As shown in Table 1 and Table 2 below, similar test results to those in Example 1 were obtained.

COMPARATIVE EXAMPLES 2 AND 3

Except that in place of the p-hexylphenol.formaldehyde novolak resin used in Example 1, m-cresol.formaldehyde novolak resin (weight-average molecular weight: 1620) and p-t-butylphenol.formaldehyde novolak resin (weight-average molecular weight: 1780) were independently used and that a pre-baking was effected under the conditions of the temperature of 85° C. and for the length of time of 1 minute, followed by baking at 120° C. for 3 minutes, acid resistance tests and film-removability tests were performed in same manners as in Example 1. Results of determinations are shown also in Table 1 and Table 2 below.

In each of the use of m-cresol.formaldehyde novolak resin and the use of p-t-butylphenol.formaldehyde novolak resin, crack-shaped patterns were observable on the surface of protective films after the etching, but no color change took place with the aluminum pads covered with the protective films. The above generation of crack-shaped patterns is thought to be due to that the acid resistance of the above resins does not come up to the comparable resistance of the resins used in Examples 1 and 2.

TABLE 1

| | Carbon atom number in alkyl group | Number (out of 80) Of Al pads underwent color change Remover chemical methanol | ethanol | isopropyl alcohol | acetone | Change in the surface of protective film after etching |
|---|---|---|---|---|---|---|
| Example 1 | 6 | 0 | 0 | 0 | 0 | no change |
| Example 2 | 8 | 0 | 0 | 0 | 0 | no change |
| Comparative Example 2 | 1 | 0 | 0 | 0 | 0 | minute crack-type pattern |
| Comparative Example 3 | 4 | 0 | 0 | 0 | 0 | minute crack-type pattern |

TABLE 2

| | Required time for film removal (minute) methanol | ethanol | isopropyl alcohol | acetone |
|---|---|---|---|---|
| Example 1 | 2 | 7 | 8 | 1 |
| Example 2 | 2 | 6 | 7 | 1 |
| Comparative Example 2 | 2 | hardly removed* | 30 | 1 |
| Comparative Example 3 | 2 | hardly removed* | 20 | 1 |

hardly removed*: Even after the lapse of 30 minutes, the surface of the substrate was not exposed.

EXAMPLE 3 AND COMPARATIVE EXAMPLE 4

Evaluations of the flexibility and the adhesion of protective films were conducted by scratch resistance tests according to the "Standard for Evaluation of Paints" (issued by JAPAN PAINT INSPECTING ASSOCIATION, 1970), which is known as a convenient standard for evaluating both of the flexibility and the adhesion of protective films at a same time. Using a scratch resistance tester (a product of Yasuda Seiki Seisakusho, Japan; load: 1 kg), a rating was made with reference to a standard sample (photograph). Greater points are taken to represent more desirable flexibility and adhesion characteristics (if the points are same, then it is so taken in the order of A, B and C).

Using each of the protective materials described in the above Comparative Example 1, Examples 1 and 2 and Comparative Examples 2 and 3, a protective film having a thickness of 10 μm was formed on a silicon wafer (4 inch φ), and the above described scratch resistance tests were operated to obtain results as shown in Table 3 below. From the test results, it is ascertained that with use of the monoalkylated phenol.formaldehyde novolak resin according to the present invention, it is feasible to provide a protective film having a flexibility and an adhesion which are comparable to or exceeding the flexibility and the adhesion in the cases of cyclized rubber based photoresists which are today put for practical uses.

TABLE 3

| | Material for Protective Film | Rated Points of Scratch Resistance |
|---|---|---|
| Example 3 | p-hexylphenol.formaldehyde novolak resin | 4-A |
| | p-octylphenol.formaldehyde novolak resin | 6-C |
| Comparative Example 4 | cyclized rubber based photoresist | 4-A |
| | m-cresol.formaldehyde novolak resin | 2-C |
| | p-t-butylphenol.formaldehyde novolak resin | 2-A |

Rated Points of Scratch Resistance: Rated for 12 grades of 0, 2-C, 2-B, 2-A, 4-C, 4-B, 4-A, 6-C, 6-B, 6-A, 8 and 10 in the order of a less desirable scratch resistance to a more desirable scratch resistance.

EXAMPLE 4

As shown in FIG. 1, on a silicon substrate or wafer 1 on which there are mounted elements 2 such as transistors and resistances, an insulator 3 of for example $SiO_2$, an interlevel insulator 4 comprising PSG for example, a covering 5 comprising PSG or a processed PSG provided on the surface thereof with plasma $Si_3N_4$, electrodes 6, a first-layer interconnection element 7 comprising for example aluminum, a second-layer interconnection element 8 comprising for example aluminum and wire bonding pads 9, a solution of respective protective materials was applied by coating, and a baking was operated at 100° C. for 5 minutes to form a protective film 10 having a thickness of 20 μm.

For the protective materials, use was made of each of p-octylphenol.formaldehyde novolak resin (weight-average molecular weight: 1830) and p-laurylphenol.-formaldehyde novolak resin (weight-average molecular weight: 1750), which were dissolved in 2-ethoxy ethyl acetate to prepare solutions having a solid concentration of 50%, and each solution was filtered through a Teflon-made membrane filter having a pore size of 0.5 μm.

Figure 2:
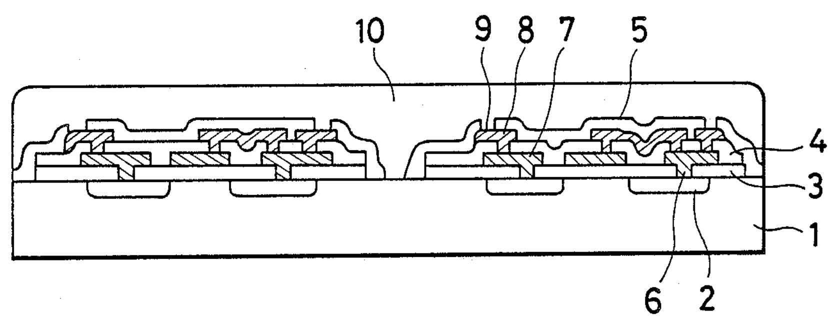
FIG. 2 is also a schematic sectional view but shows an intermediate condition in which the backside surface of the semiconductor substrate of FIG. 1 on which the semiconductor elements and so forth are not provided has been subjected to grinding or etching to reduce the thickness of the substrate.

The backside surface of respective silicon plates 1 was subjected to a mechanical grinding or chemical etching to reduce the thickness of each silicon plate 1 as shown in FIG. 2. In the case of the mechanical grinding, use was made of a grinding machine as disclosed in the U.S. Pat. Nos. 4,481,738 or 4,583,325 before referred to.

In the case of the chemical etching, then, the silicon wafer formed with the protective film 10 was dipped for several minutes in the above described etchant comprising a mixed acid of hydrofluoric acid and nitric acid, maintained at 30° C., and thereafter spin washing with super-demineralized water and spin drying were performed.

As a result of the mechanical grinding, none of cracking or other desctructions was generated in the protective film 10, which also showed a sufficient resistance to etchant as a result of the chemical etching. Thus, by each of the mechanical grinding and the chemical etching, it was possible to reduce the thickness of silicon wafers which was for example 500 to 600 μm to a thickness on the order of several tens of a $\mu$m to a thickness of 200 to 300 $\mu$m.

Figure 3:
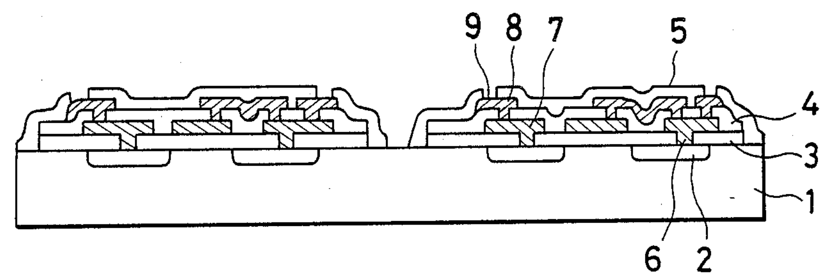
FIG. 3 is a schematic sectional view, showing a final condition in which the protective film shown in FIGS. 1 and 2 has been removed.

Lastly, the wafer 1 was immersed in ethanol to thereby remove the protective film 10 as shown in FIG. 3. The removal of the protective film 10 could be effected within a short period of time with a desirable result. With use of isopropyl alcohol in place of ethanol, too, the removal of the protective film 10 took place in a desirable manner.

What is claimed is:

1. A process for the production of electronic parts, which comprises the following steps A to C:

A. covering a device side surface of a semiconductor plate on which semiconductor elements are mounted with a film of a protective material for electronic parts comprising a novolak resin prepared by reacting a monoalkyl phenol having 6 to 12 carbon atoms in the alkyl group with formaldehyde;

B. finishing the other or backside surface of the semiconductor plate, not covered with the film of protective material, to reduce the thickness of the plate; and C. removing the film of protective material with a solvent.

2. The process as claimed in claim 1, wherein the carbon atom number in the alkyl group is 6 to 8.

3. The process as claimed in claim 1, wherein the alkylated phenol is p-alkylated phenol.

4. The process as claimed in claim 1, wherein the protective film is formed by coating a solvent solution of the protective material.

5. The process as claimed in claim 1, wherein the finishing of the backside surface is carried out by one of the methods consisting of a mechanical grinding and a chemical etching.

6. The process as claimed in claim 1, wherein the solvent is a member selected from the group consisting of alcohols, ketones and mixtures thereof.

* * * * *